(12) United States Patent
Zhao et al.

(10) Patent No.: US 10,753,967 B2
(45) Date of Patent: Aug. 25, 2020

(54) ELECTROMAGNETIC INTERFERENCE (EMI) EVALUATION SYSTEM FOR IMAGE SENSORS

(71) Applicant: OmniVision Technologies, Inc., Santa Clara, CA (US)

(72) Inventors: Qianyi Zhao, San Jose, CA (US); Xiaojun Zhang, Shanghai (CN); Pan-Xun Jiang, Shanghai (CN); Bao-Hua Xu, Shanghai (CN); Heng Fan, Palo Alto, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 16 days.

(21) Appl. No.: 16/201,806

(22) Filed: Nov. 27, 2018

(65) Prior Publication Data

US 2019/0162769 A1 May 30, 2019

Related U.S. Application Data

(60) Provisional application No. 62/591,021, filed on Nov. 27, 2017.

(51) Int. Cl.
| | |
|---|---|
| *G01R 31/00* | (2006.01) |
| *H05K 1/18* | (2006.01) |
| *H05K 7/14* | (2006.01) |
| *H05K 9/00* | (2006.01) |
| *H05K 1/11* | (2006.01) |

(Continued)

(52) U.S. Cl.
CPC ......... *G01R 31/001* (2013.01); *H04B 17/102* (2015.01); *H04B 17/345* (2015.01); *H05K 1/0216* (2013.01); *H05K 1/0231* (2013.01); *H05K 1/115* (2013.01); *H05K 1/181* (2013.01); *H05K 3/32* (2013.01); *H05K 7/1427* (2013.01); *H05K 9/0007* (2013.01); *H05K 2201/10015* (2013.01); *H05K 2201/10121* (2013.01);

(Continued)

(58) Field of Classification Search
CPC .... H05K 1/0216; H05K 1/0231; H05K 1/115; H05K 1/181; H05K 2201/10151; H05K 2201/10545; H05K 2201/10098
See application file for complete search history.

(56) References Cited

U.S. PATENT DOCUMENTS

| | | | |
|---|---|---|---|
| 2002/0190610 A1* | 12/2002 | Andre | ..................... H02N 2/18 310/339 |
| 2012/0184326 A1* | 7/2012 | Asterland | ............ H05K 1/0216 455/550.1 |

(Continued)

*Primary Examiner* — Dominic E Hawkins
(74) *Attorney, Agent, or Firm* — Lathrop GPM LLP (57) ABSTRACT

An apparatus configured to measure electromagnetic radiation coupled from an image sensor integrated circuit (IC) to a nearby cell phone antenna has an image sensor PCB with the image sensor IC on a first side and image sensor decoupling capacitors disposed on a second side, the image sensor PCB disposed within a shielding box. The apparatus also has an image processor PCB with an image processor IC on a first side and at least one image processor decoupling capacitors, the image processor IC electrically coupled to the image sensor IC. The image processor IC is located outside the shielding box, and the at least one image processor decoupling capacitor is within the shielding box. In embodiments, the decoupling capacitors are shielded with separate, additional, metal covers.

8 Claims, 5 Drawing Sheets

(51) Int. Cl.
*H05K 1/02* (2006.01)
*H05K 3/32* (2006.01)
*H04B 17/345* (2015.01)
*H04B 17/10* (2015.01)

(52) U.S. Cl.
CPC .............. *H05K 2201/10151* (2013.01); *H05K 2201/10545* (2013.01)

(56) References Cited

U.S. PATENT DOCUMENTS

| | | | |
|---|---|---|---|
| 2013/0193984 A1* | 8/2013 | Kim | G01R 29/0814 |
| | | | 324/613 |
| 2019/0037683 A1* | 1/2019 | Han | G06F 1/1658 |
| 2019/0098802 A1* | 3/2019 | Mokler | H01L 23/552 |
| 2019/0116297 A1* | 4/2019 | Youmans | H04N 5/2252 |

\* cited by examiner

ELECTROMAGNETIC INTERFERENCE (EMI) EVALUATION SYSTEM FOR IMAGE SENSORS

CROSS REFERENCE TO RELATED APPLICATIONS

The present application claims priority from U.S. Provisional Patent Application No. 62/591,021 filed 27 Nov. 2017; the entire contents of which are incorporated herein by reference.

BACKGROUND

Cell phones contain a mix of electronic components, including image sensors that may or may not contain on-chip digital image processors, high-performance digital processors, memory circuits, active-matrix displays, power supply components including battery chargers, clock and frequency synthesis circuits, and digital radio transceivers. All these components may generate radio-frequency emissions, and, because of the compact nature of cell phones, are of necessity located in close proximity to at least one antenna and components of the receiver side of the digital radio transceivers. These digital radio transceivers may include transceivers operable from 460 to 6000 MHz to cover an assortment of base cell phone, LTE (long term evolution) cell phone, Bluetooth, Bluetooth low energy, IEEE 802.11 (WiFi) and other digital radio standards. These radio frequency emissions can couple through the antenna and directly to receiver side components to cause electromagnetic interference (EMI) with the digital radio transceivers.

Cell phone manufacturers and component manufactures need to understand how much of these radio frequency radiations (RFR) arises from each component of the cell phone, their cause, and how to reduce their coupling into the antennas and receiver side components that causes EMI to design phones less affected by EMI than competing phones. Phones less affected by EMI are more likely to have long range at low power where wanted signals to the digital radio transceivers are weak. It is important to not only understand RFR magnitude, but also frequency distribution since particular signals, such SCLK (an internal clock signal) of an image sensor, may produce significant EMI at both fundamental and multiple harmonics of their fundamental frequencies.

Improper design of sensor circuits, poor layout within the phone, poor shielding, poor antenna design, and other issues can allow RFR from sensors at such frequencies and their harmonics to jam digital radio communications attempted by the cell phone. For cell phone designs, EMI issues usually are reported at a very late stage of phone design by imaging sensor customers, usually right before the mass production of their products, demanding solutions in a very short time.

It is important that unavoidable RFR from the sensor IC itself be quantified separately from RFR from other portions of an imaging subsystem because solutions requiring internal changes to the sensor IC design are much more costly and take far longer to implement than solutions requiring modifications to printed circuit board layout and other components within the phone.

Sensor IC RFR must also be quantified with the sensor IC operating at full speed. Further, because radiated harmonics increase sharply as rise and fall times of signals decrease, sensor IC RFR must be characterized with low capacitive loading comparable to that found on signal lines internal to a cell phone, not the significantly greater loading typical of signal lines of general purpose IC test equipment.

SUMMARY

We seek to characterize magnitude and frequencies of RFR from image sensors and other cell phone components to permit resolving EMI issues in an early stage of development of a cellular phone product.

In an embodiment, an apparatus is configured to measure electromagnetic radiation coupled from an image sensor integrated circuit (IC) to a nearby cell phone antenna has an image sensor PCB with the image sensor IC on a first side and image sensor decoupling capacitors disposed on a second side, the image sensor PCB disposed within a shielding box. The apparatus also has an image processor PCB with an image processor IC on a first side and image processor decoupling capacitors, the image processor IC electrically coupled to the image sensor IC. The image processor IC is located outside the shielding box, and the at least one image processor decoupling capacitor is within the shielding box.

In another embodiment, a method of measuring electromagnetic radiation coupled from an image sensor integrated circuit (IC) to a nearby cell phone antenna, includes mounting the image sensor IC on a first side of an image sensor PCB, mounting at least one image sensor decoupling capacitor on a second side of the image sensor PCB, mounting an image processor IC on a first side of an image processor PCB, and mounting at least one image processor decoupling capacitor on the image processor PCB. The method also includes electrically coupling the image processor IC to the image sensor IC with the image processor IC outside a shielded compartment, and with the at least one image processor decoupling capacitor within the shielded compartment; positioning an antenna near the image sensor IC, the image sensor IC and antenna being within the shielded compartment; driving the image sensor IC at full operating speed; and measuring electromagnetic radiation picked up by the antenna.

DETAILED DESCRIPTION OF THE EMBODIMENTS

Principles

It is well known that the switching of capacitive loads internal to integrated circuits, as well as switching of capacitive loads at bonding pads of integrated circuits, causes significant current spikes at power and ground pads of the integrated circuits. These current spikes have strong components at fundamental clock frequencies of the integrated circuits and many harmonics of those frequencies. Decoupling capacitors help suppress voltage surges from these current spikes by diverting high frequency components to an electrical ground, and help reduce radio frequency emissions from them up to several hundred MHz.

Decoupling capacitors connect to bondpads of integrated circuits through interconnect including bondwires, leadframes, printed circuit board (PCB) vias and traces, and, if present, capacitor leads. Current spikes through any of these conductors may induce electromagnetic radiation, causing RFR, adding to EMI—and the sharper the spike the broader the spectrum of the radiation.

When measuring RFR due to the sensor chip, we have found that the bypass capacitors used to handle surge current spikes should be shielded and connect as directly as possible to the sensor chip through vias.

In an embodiment, a test setup 100 (FIG. 1) has an antenna 102 similar to a production cell phone antenna coupled through a connector 104 and cable 106 to an external spectrum analyzer 108. A photosensor-array image sensor integrated circuit (IC) 110 is wirebonded to a sensor printed circuit board (PCB) 112 with bond wires 114, and spacers 116 position antenna 102 at an appropriate distance from sensor PCB 112. The sensor IC has no separate package. Decoupling capacitors 120, 122, are positioned inside shields 124 on a backside of the sensor PCB 112 and on a front side of an image processing PCB 126. Image processing PCB 126 is separated by spacers 128 from sensor PCB 112. Connectors 130, 132, resembling miniature connectors as commonly used in cell phones, are provided for coupling signals from sensor PCB 112 to image processing PCB 126.

Figure 1:
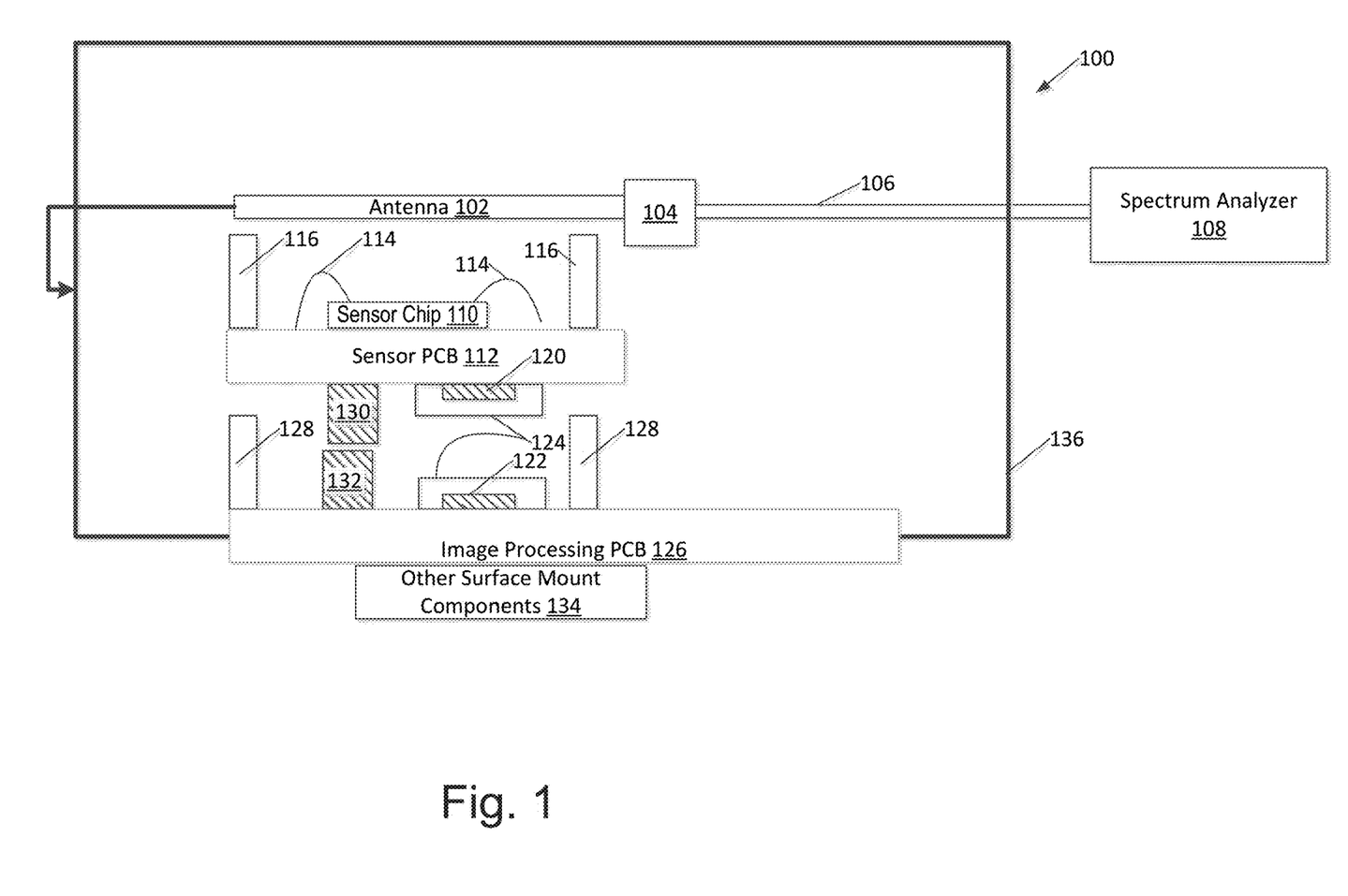
FIG. 1 is a cross sectional diagram of a system for characterizing radio frequency radiations (RFR) from an image sensor module of a cell phone.

Additional surface-mount components 134 may be mounted to the image processor PCB, and a shielded box 136, the shielded box being a box formed of electrically conductive material, is positioned around antenna 102, sensor PCB 112, and image processing PCB 126.

Sensor PCB

In a particular embodiment, sensor PCB 200 (FIG. 2) is a 6 or 8 layer flexible PCB. Sensor PCB 200 with sensor IC 110 bonded to pads 202 on an upper metal layer 204 of sensor PCB 200, these pads 202 are coupled by vias 206 to an interconnect layer 208 of sensor PCB 200, a power layer 210 of sensor PCB 200, or to a ground-plane layer such as upper metal layer 204, middle ground 212, lower ground 214, or bottom ground 216. Each pad 202 is surrounded by grounded metal on upper metal layer 204, upper metal layer 204 serves largely as a top ground-plane layer as to middle ground 212, lower ground 214, and bottom ground 216. Grounded metal on upper metal layer 204 shields the sensor IC from other potentially-radiating components on sensor PCB 200, and traces on interconnect layer 208 are shielded from both the sensor IC and other components of PCB 200 by grounded metal on upper metal layer 204, middle ground layer 212, lower ground layer 214, and bottom ground layer 216. Decoupling capacitors 218, of which there may be five or six in various embodiments, are mounted on a lower side of sensor PCB 200, opposite the side on which the sensor IC is bonded; these capacitors are coupled to the power layer 210 and sensor IC power pads by short vias 220 through the image sensor PCB.

Figure 2:
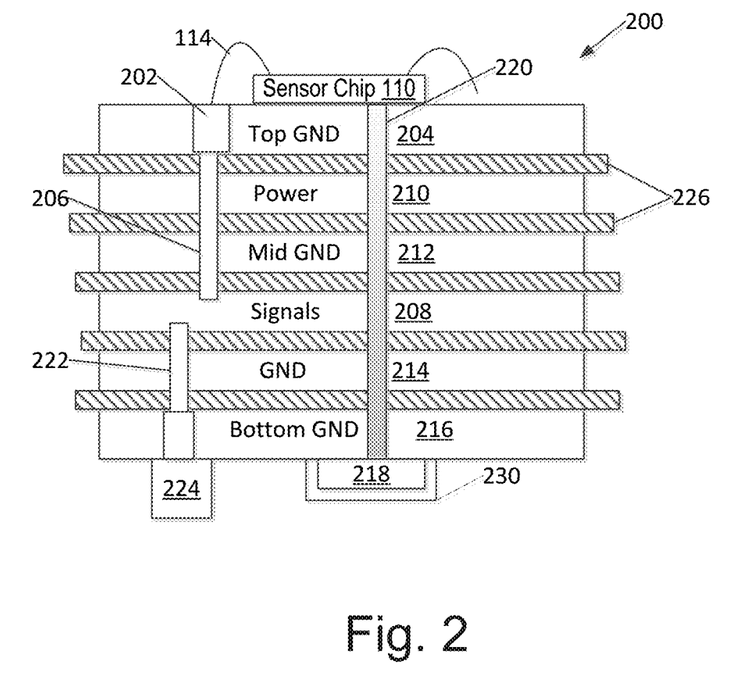
FIG. 2 is a schematic cross sectional view illustrating features of the test system sensor printed circuit board.

Metal layers 204, 210, 212, 214, 216 of sensor PCB 200 are separated by dielectric and support layers 226, as known in the multilayer PCB art.

In an embodiment, via and trace length from power and ground connections of image sensor IC 110 to decoupling capacitors is under two millimeters (mm.). In a particular embodiment, via and trace length from power and ground bondpads of image sensor IC 110 to the image sensor decoupling capacitors is less than one mm, this one mm excludes length of bondwires 114.

Signals from the sensor IC 110 brought by vias 206 to interconnect layer to signals layer 208 are in turn brought by additional vias 222 to a shielded mini connector 130, 224 for coupling these signals to the image processing PCB.

Image Processing PCB

Image processing PCB 126, 300 (FIG. 3) has lateral grounded metal on an upper ground layer 310 soldered to a metal wall 311 of, and forms a part of, shielded box 136. A central portion of image processing PCB 126 located as directly opposite the sensor IC of the sensor PCB 112 as practical, includes a connector 132, 302, an image processor 304, decoupling capacitors 306, along with the PCB itself. PCB 300 has an upper ground layer 310, power layer 312, middle ground layer 314, signal layer 316, lower ground 318, and bottom ground layers 320. As is usual in the PCB art, the metal layers 310, 312, 314, 316, 318, 320 are separated by dielectric and support layers 324.

Figure 3:
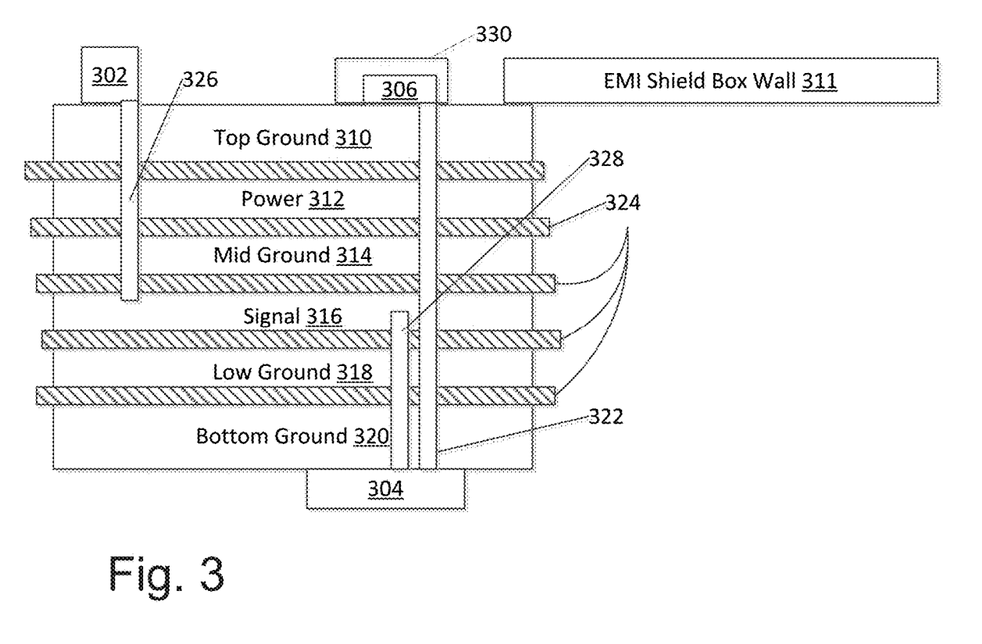
FIG. 3 is a schematic cross sectional view illustrating features of the test system image processing board.

Decoupling capacitors 306 of image processing PCB 300 are located on an upper surface, the same surface as connector 302, so that they lie within the shielded box, being shielded from antenna 102 by grounded metal on ground layers 204, 212, 214, 216 of sensor PCB 200 and from external areas by upper ground layer 310 of the image processing PCB.

Image processor 304 of image processing PCB 300 is surface mounted, together with any additional necessary surface mount components, on a lower surface of the image processing PCB, and as nearly opposite the decoupling capacitors 306 as practical. The decoupling capacitors couple through short vias 322 through the image processing PCB with minimal-length traces, in a particular embodiment total length of via and trace is less than one mm, to power and ground connections of image processor 304. Vias 326, 328 are also provided to connect signals from connector 302 to signal layer 316, and from signal layer 316 to image processor 304.

In a particular embodiment, a copper cover 330 is placed over the decoupling capacitors 306 of image processing PCB, and soldered to grounded metal of upper ground layer 310. Another copper cover 230 is placed over the decoupling capacitors 218 of the sensor board and soldered to grounded metal of bottom ground layer 216.

The testing system therefore enables accurate measurement of radiation from sensor chip unobtainable with conventional testing setups and, by fixing positions of sensor PCB relative to antenna, yields comparable results for various sensor products.

Operation

In operation, a test technician mounts the image processing PCB 300, 402 (FIG. 4) to a shield plate 403 at a rear of a shield box 400, in a particular embodiment an outer grounded portion of top ground metal 310 of image processing PCB 402 is soldered to shield plate 403. The technician attaches a sheet-copper lid 404 over the bypass capacitors 406 of the image processing PCB 402. The technician attaches a similar lid over the bypass capacitors (not shown in FIG. 4) of the sensor PCB 408, then attaches the connector of the sensor PCB 408 to the image processing PCB to electrically couple the image sensor IC to the image processor IC. Finally, the technician mounts the antenna 410 over the image sensor PCB 408, and closes a lid 412 of shielded box 400. At this point shield plate 403 together with a top ground metal 310 of image processing PCB 402 and other components of shield box 400 form a closed, metallic, shielded compartment surrounding sensor PCB 408, antenna 410, and decoupling capacitors 306 with the image processor IC 304 and other surface-mount components either outside the shielded compartment or in a second shielded compartment. The shielded compartment of the shield box is configured to exclude ambient electromagnetic radiation, such as cell phone signals, from antenna 410.

Figure 4:
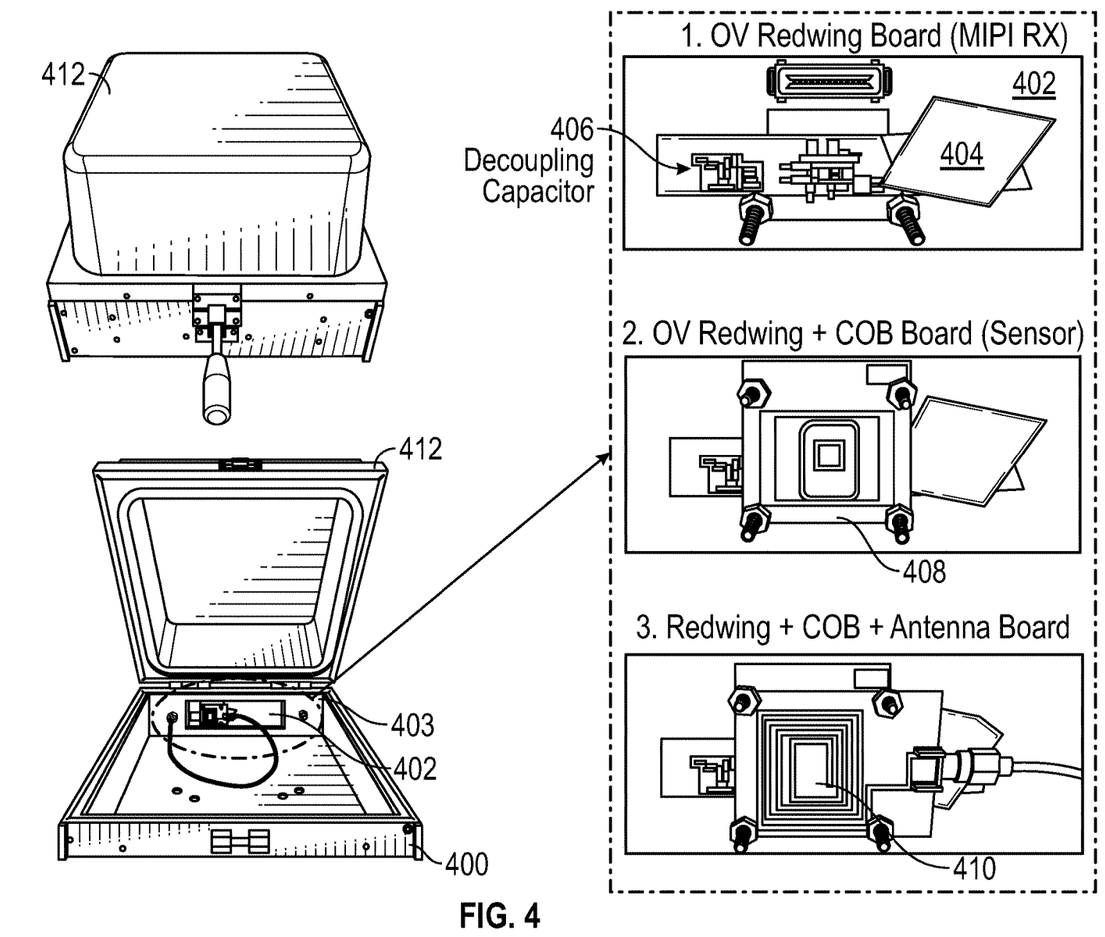
FIG. 4 illustrates an EMI test system according to FIGS. 1-3 assembled into a shielded box for operation.

Next, the technician drives the image processing PCB 402 such that both the sensor IC and image processor are actively switching with potential to radiate RFR, and measures a spectrum of radiated RFR with spectrum analyzer 108 (FIG. 1).

Figure 5:
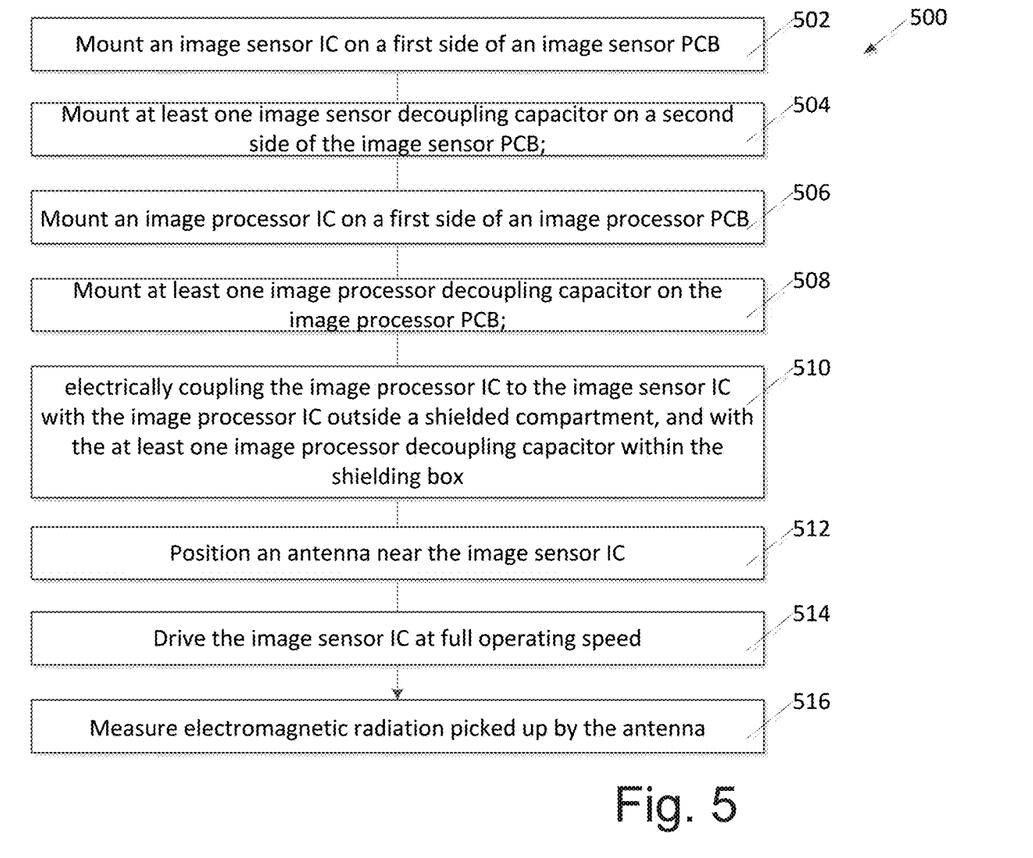
FIG. 5 is a flowchart of a method of characterizing RFR coupled from an image sensor module of a cell phone to a cell phone antenna.

A method 500 (FIG. 5) of measuring electromagnetic radiation coupled from an image sensor integrated circuit (IC) to a nearby cell phone antenna, includes mounting 502 the image sensor IC on a first side of an image sensor PCB, mounting 504 at least one image sensor decoupling capacitor on a second side of the image sensor PCB, mounting 506 an image processor IC on a first side of an image processor PCB, and mounting 508 at least one image processor decoupling capacitor on the image processor PCB. These mounting steps may be performed in any order. The method also includes electrically coupling 510 the image processor IC to the image sensor IC, such as by coupling mating connectors on the image processor and image sensor ICs, with the image processor IC outside a shielded compartment, and with the at least one image processor decoupling capacitor within the shielded compartment. The method includes positioning 512 an antenna near the image sensor IC, the image sensor IC and antenna being within the shielded compartment; driving 514 the image sensor IC at full operating speed; and measuring 516 the electromagnetic radiation picked up by the antenna.

Combinations of Features

The various features herein described may be combined in multiple ways, some of which are described below. In particular, in some embodiments none of, one of, or both of, the image sensor decoupling capacitors and the image processor decoupling capacitors are covered by separate shielding boxes or lids.

An apparatus designated A configured to measure electromagnetic radiation coupled from an image sensor integrated circuit (IC) to a nearby cell phone antenna, has an image sensor printed circuit board (PCB) having attached thereto on a first side of the image sensor PCB the image sensor IC, the image sensor PCB comprising at least one image sensor decoupling capacitor disposed on a second side of the image sensor PCB different from the first side of the image sensor IC, the image sensor PCB disposed within a shielding box; an image processor PCB including an image processor IC disposed on a first side of the image processor PCB, the image processor PCB having at least one image processor decoupling capacitor, the image processor IC being electrically coupled to the image sensor IC on the image sensor PCB; the image processor IC being located outside the shielding box, and at least one image processor decoupling capacitor being disposed within the shielding box.

An apparatus designated AA including the apparatus designated A, having the at least one image processor decoupling capacitor covered by a metal shield disposed over the at least one image processor decoupling capacitor and the capacitor is electrically connected to the image processor by interconnect comprising vias through the image processor PCB.

An apparatus designated AB including the apparatus designated A or AA, wherein the at least one image sensor decoupling capacitor is covered by a metal shield disposed over the image sensor decoupling capacitor and the at least one image sensor decoupling capacitor is electrically coupled to the image sensor by interconnect comprising vias through the image sensor PCB.

An apparatus designated AC including the apparatus designated A, AA, or AB the image sensor PCB has at least a top ground metal layer, a bottom ground metal layer, and a power metal layer.

An apparatus designated AD including the apparatus designated A, AA, AB, or AC where the image processor PCB has at least a top ground metal layer, a bottom ground metal layer, and a power metal layer.

A method designated B of measuring electromagnetic radiation coupled from an image sensor integrated circuit (IC) to a nearby cell phone antenna, includes mounting the image sensor IC on a first side of an image sensor PCB, mounting at least one image sensor decoupling capacitor on a second side of the image sensor PCB, mounting an image processor IC on a first side of an image processor PCB, and mounting at least one image processor decoupling capacitor on the image processor PCB; the mounting steps may be performed in any order. The method continues with electrically coupling the image processor IC to the image sensor IC with the image processor IC outside a shielded compartment, and with the image sensor IC and the at least one image processor decoupling capacitor within the shielded compartment; positioning an antenna near the image sensor IC within the shielded compartment; driving the image sensor IC at full operating speed; and measuring electromagnetic radiation picked up by the antenna.

CONCLUSION

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An apparatus configured to measure electromagnetic radiation coupled from an image sensor integrated circuit (IC) to a nearby cell phone antenna, comprising:
    an image sensor printed circuit board (PCB) having attached thereto on a first side of the image sensor PCB the image sensor IC, the image sensor PCB comprising at least one image sensor decoupling capacitor disposed on a second side of the image sensor PCB different from the first side of the image sensor PCB, the image sensor PCB disposed within a shielding box;
    an image processor PCB including an image processor IC disposed on a first side of the image processor PCB, the image processor PCB having at least one image processor decoupling capacitor, the image processor IC being electrically coupled to the image sensor IC on the image sensor PCB;
    the image processor IC being located outside the shielding box, and
    the at least one image processor decoupling capacitor being disposed within the shielding box.

2. The apparatus of claim 1, wherein the at least one image processor decoupling capacitor is covered by a metal shield disposed over the image processor decoupling capacitor and the at least one image processor decoupling capacitor is electrically connected to the image processor by interconnect comprising vias through the image processor PCB.

3. The apparatus of claim 2, wherein the at least one image sensor decoupling capacitor is covered by a metal shield disposed over the image sensor decoupling capacitor and the at least one image sensor decoupling capacitor is electrically coupled to the image sensor by interconnect comprising vias through the image sensor PCB.

4. The apparatus of claim 2, wherein the image sensor PCB comprises at least a top ground metal layer, a bottom ground metal layer, and a power metal layer.

5. The apparatus of claim 4, wherein the image processor PCB comprises at least a top ground metal layer, a bottom ground metal layer, and a power metal layer.

6. The apparatus of claim 1, wherein the at least one image sensor decoupling capacitor is covered by a metal shield disposed over the image sensor decoupling capacitor and is electrically coupled to the image sensor by interconnect comprising vias through the image sensor PCB.

7. The apparatus of claim 6, wherein the image sensor PCB comprises at least a top ground metal layer, a bottom ground metal layer, and a power metal layer, the power metal layer disposed between the top ground metal layer and the bottom ground metal layer; and the image processor PCB comprises at least a top ground metal layer, a bottom ground metal layer, and a power metal layer.

8. A method of measuring electromagnetic radiation coupled from an image sensor integrated circuit (IC) to a nearby cell phone antenna, comprising:
  mounting the image sensor IC on a first side of an image sensor PCB;
  mounting at least one image sensor decoupling capacitor on a second side of the image sensor PCB;
  mounting an image processor IC on a first side of an image processor PCB;
  mounting at least one image processor decoupling capacitor on the image processor PCB;
  electrically coupling the image processor IC to the image sensor IC with the image processor IC outside a shielded compartment, with the image sensor IC within the shielded compartment, and with the at least one image processor decoupling capacitor within the shielded compartment;
  positioning an antenna within the shielded compartment and near the image sensor IC;
  driving the image sensor IC at full operating speed; and
  measuring electromagnetic radiation picked up by the antenna.

* * * * *